(12) United States Patent
Kirkpatrick (10) Patent No.: US 8,081,705 B2
(45) Date of Patent: Dec. 20, 2011

(54) DIGITAL VIDEO PHYSICAL LAYER USING A MULTI-LEVEL DATA CODE

(75) Inventor: Philip L. Kirkpatrick, Dumont, NJ (US)

(73) Assignee: Crestron Electronics Inc., Rockleigh, NJ (US)

( * ) Notice: Subject to any disclaimer, the term of this patent is extended or adjusted under 35 U.S.C. 154(b) by 776 days.

(21) Appl. No.: 12/163,409

(22) Filed: Jun. 27, 2008

(65) Prior Publication Data

US 2009/0323831 A1 Dec. 31, 2009

(51) Int. Cl.
*H04B 3/50* (2006.01)
*H04L 25/49* (2006.01)
*H03M 7/00* (2006.01)

(52) U.S. Cl. ........ 375/288; 375/293; 375/286; 375/287; 375/257; 375/258; 327/52; 341/143

(58) Field of Classification Search ............. 375/356, 375/240; 325/28; 370/528; 341/106
See application file for complete search history.

(56) References Cited

U.S. PATENT DOCUMENTS

| | | | | |
|---|---|---|---|---|
| 4,123,710 A * | 10/1978 | Stuart et al. | | 375/263 |
| 4,486,739 A | 12/1984 | Franaszek | | |
| 6,052,390 A * | 4/2000 | Deliot et al. | | 370/528 |
| 6,225,924 B1 | 5/2001 | Epshtein | | |
| 6,975,674 B1 | 12/2005 | Phanse | | |
| 7,359,437 B2 * | 4/2008 | Hwang et al. | | 375/240 |

* cited by examiner

*Primary Examiner* — Khanh C Tran
*Assistant Examiner* — Ross Varndell (57) ABSTRACT

Digital video data is transmitted from a video source (61) to a video sink (62) as a group of three multilevel symbols (611, 612, and 613) per pixel color with each associated symbol being sent at a rate of three times the pixel clock (601). When eleven levels are used per symbol (611) and undesirable symbol groups having excess DC residual or minimal energy are eliminated, and a built-in-test symbol group is added for pixel alignment; there results a one-to-one correspondence between the remaining symbol groups available and the two-hundred and sixty possible states that are used in the TMDS physical layer that is in widespread commercial use.

21 Claims, 6 Drawing Sheets

DIGITAL VIDEO PHYSICAL LAYER USING A MULTI-LEVEL DATA CODE

BACKGROUND OF THE INVENTION

1. Technical Field

This invention relates to apparatus and methods for communicating data, and more specifically communicating data over a plurality of channels, such as a cable having a plurality of conductors (for example, four twisted pairs of wires), and for encoding and/or decoding data in connection with such communications.

2. Background Art

Figure 1:
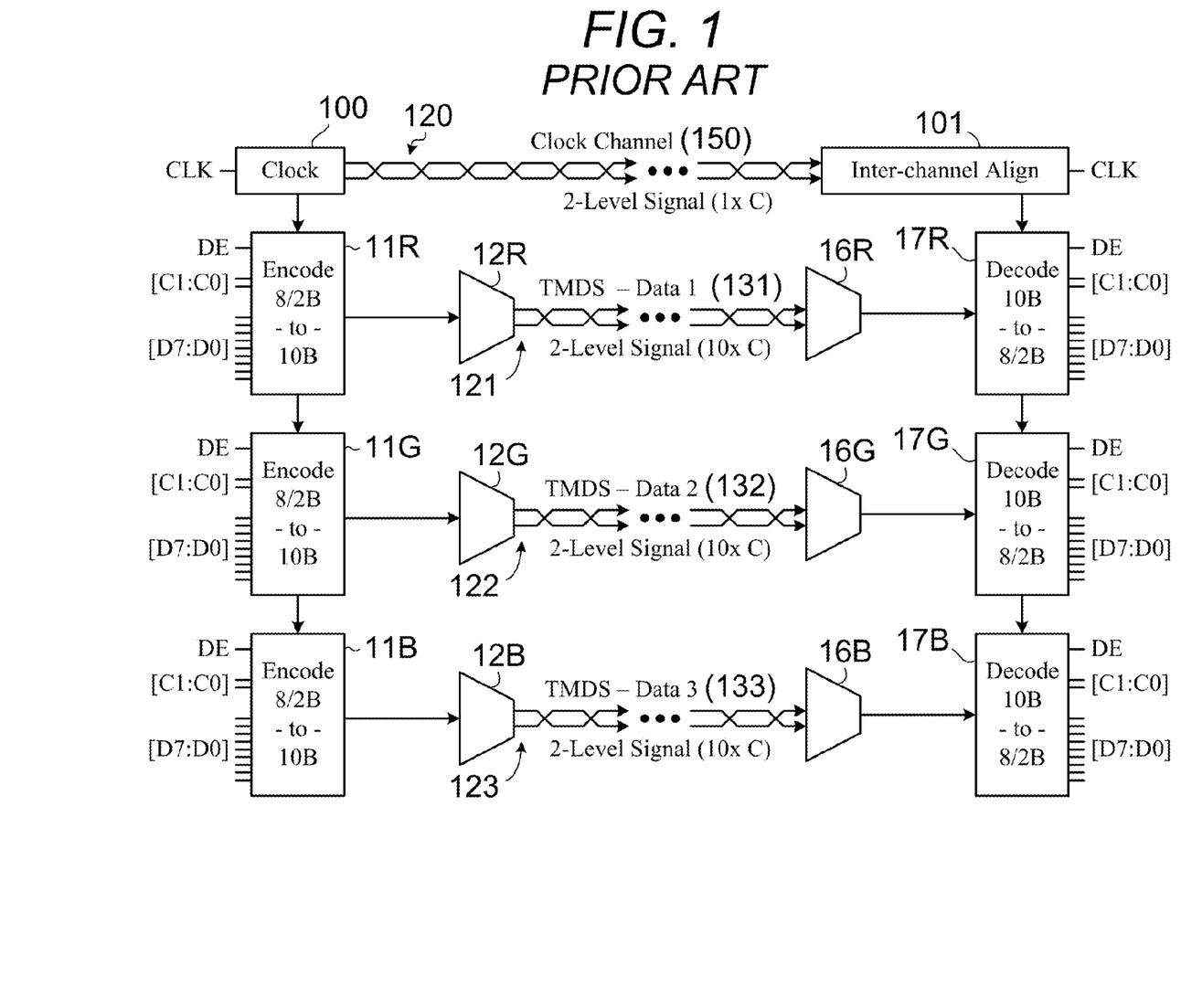
FIG. 1 shows a TMDS physical layer as is known in the prior art.

FIG. 1 illustrates the prior art transition minimized differential signaling (TMDS) physical layer that was developed by Silicon Image Inc. as a member of the Digital Display Working Group and is used in both the well-known Digital Visual Interface (DVI) and High Definition Multimedia Interface (HMDI).

TMDS is a physical layer technology for transmitting high-speed serial data in a simplex mode from one transmitter to one receiver. A useful description of this TMDS interface is included in the background section of Hwang (U.S. Pat. No. 7,359,437). The TMDS transmitter incorporates a coding algorithm designed to minimize electromagnetic interference (EMI) over copper cables. The algorithm is a form of eight-bit binary to ten-bit binary (8B:10B) coding, similar to that described in Franaszek (U.S. Pat. No. 4,486,739) but using a different code-set that differs from the IBM originated form. Hwang describes yet another form of eight-bit binary to ten-bit binary (8B:10B) coding that may be more effective than the TMDS coding algorithm at reducing inter-symbol interference. Each TMDS ten-bit word can represent either an eight-bit data value, typically representing video pixel data, or alternatively a two-bit control value, typically used for horizontal and vertical sync during screen blanking. Such a TMDS coding algorithm can therefore be described as an eight-symbol, alternatively two-symbol, binary (base-two) to ten-symbol binary (base-two) coding algorithm and is represented herein in short hand form as '8/2B:10B'.

In the TMDS coding scheme, four hundred sixty (460) combinations, out of the possible one thousand twenty four (1024) combinations, for a 10-bit binary word, are used for representing an 8-bit data value. Some of the two hundred fifty six (256) possible values, of each 8-bit binary word, are encoded using a single variant and other values have two encoded variants. Four combinations, of the 10-bit binary output word, are used for representing a 2-bit control word used for TMDS control signals, such as horizontal and vertical sync video signals.

FIG. 1 depicts a typical TMDS interface configured to transmit red-green-blue (RGB) video data. TMDS uses four twisted wire pairs (120, 121, 122, and 123) to transmit a clock channel 130 and three data channels (131, 132, and 133). Red video data 131 is transmitted as a serial stream of ten, as described above, 2-level (binary) symbols per pixel into a first twisted pair 121 of wires at a rate of between 250 MHz and 3.4 GHz. Green video data 132 is transmitted as a serial stream of ten 2-level (binary) symbols per pixel into a second twisted pair 122 of wires at a rate of between 250 MHz and 3.4 GHz. Blue video data 133 is transmitted as a serial stream of ten 2-level (binary) symbols per pixel into a third twisted pair 123 of wires at a rate of between 250 MHz and 3.4 GHz. A pixel clock 100 transmits clock data 130 consisting of one 2-level (binary) symbol per pixel into a fourth twisted pair 120 of wires at a rate of between 25 MHz and 340 MHz, or one-tenth the symbol rate of the data channels.

TMDS uses DC-coupled current mode logic (CML), terminated to 3.3 volts and DC balanced by the encoding algorithm. Each TMDS data channel includes an eight-symbol, alternatively two-symbol, binary (base-two) to ten-symbol binary (8/2/B:10B) encoder (11R, 11G, and 11B), a twisted wire pair (121, 122, and 123), and a ten-symbol binary to eight-symbol, alternatively two-symbol, binary decoder (17R, 17G, and 17B). The clock channel 130 is used for inter-channel alignment 101, such as between the three data channels (131, 132, and 133), at the receiving side of the interface. Typical TMDS data channels (131, 132, and 133) will also include pre-emphasis stages (12R, 12G, and 12B) and equalization stages (16R, 16G, and 16B).

In a different area of the prior art, communication systems have been developed which use more than two voltage levels to represent digital data. For example, a four-level pulse amplitude modulated system (PAM-4) will encodes two binary bits at a time and map the resulting signal amplitude to one of four possible voltage levels, such as −3 volts, −1 volt, 1 volt, and 3 volts. Demodulation is performed by detecting the amplitude level of the carrier at every symbol period. Each of these prior art systems transmits data in two-directions (full-duplex) and derives a clock signal from its data channels, rather than having a dedicated clock channel.

Phanse (U.S. Pat. No. 6,975,674) describes a PAM-5 (e.g. five voltage levels per symbol) interface that is suitable for transmitting 125 mega-symbols per second (125 MHz) per twisted wire pair on a four-pair Cat 5e cable resulting in an aggregate transmission of 500 mega-symbols per second (500 MHz) per direction in a full-duplex transmission configuration. According to Phanse, this allows for a (binary) data rate of one gigabit per second (1 Gbps). Phanse is not applicable as a replacement for TMDS because it does not have enough bandwidth for the highest video rates and because it relies on recovering the clock from the data stream, has a significant DC residual correction required, and requires echo cancellation circuitry due to the duplex nature of its anticipated communication path.

Deliot (U.S. Pat. No. 6,052,390) describes a PAM-9 (e.g. nine voltage levels per symbol) interface and is instructive in the need to manage DC residual when using multi-level signals in a transformer coupled system as well as the effect of overall energy from a multi-level symbol group in terms of resultant electromagnetic interference (EMI). However, Deloit requires that delimiters be inserted between multi-level symbol groups which introduces a significant processing overhead that is not desirable when associated with high speed video data transfer.

There continues to be a long-felt need to extend the cabling length and/or bandwidth available for high-definition media interface (HDMI) television signals which is unanswered by the prior art.

SUMMARY OF THE INVENTION

The following summary of the invention is provided to facilitate an understanding of some of the innovative features unique to the present invention. A full appreciation of the various aspects of the invention can only be gained by taking the entire specification, claims, drawings, and abstract as a whole.

DISCLOSURE OF INVENTION

In accordance with my invention, the present TMDS physical layer used in a Digital Visual Interface (DVI) is replaced with a physical layer having multiple levels per symbol and a relatively low symbol clock rate.

According to a first aspect, the present invention provides a digital visual interface system configured to transmit data, control, and BIT signals. The system includes a clock channel transmitting a clock signal at a predetermined rate, a first data channel, a second data channel, and a third data channel. The first data channel transmits data as a sequence of blocks of multi-level symbols being sent at a fixed multiple of the clock rate. The second data channel transmits data as a sequence of blocks of multi-level symbols being sent at a fixed multiple of the clock rate. The second data channel transmits data as a sequence of blocks of multi-level symbols being sent at a fixed multiple of the clock rate. Each block of multi-level symbols within said first, second, and third data channels is aligned with reference to the clock channel.

According to a second aspect, the present invention provides a method of transmitting the data and control signals normally associated with a TMDS physical layer. The method includes the steps of reading an input data set, encoding the input data set into a data block of three undenary symbols, and outputting the data block of three undenary symbols as a sequence of analog voltage levels that are synchronized with a TMDS pixel clock. The input data set includes a TMDS "Data Enable" signal, two TMDS control signals, "[C1:C0]", and eight TMDS data signals, "[D7:D0]". The data block of three undenary symbols is selected from a predetermined group of allowable data blocks in accordance with a code.

According to a third aspect, the present invention provides a method of receiving the data and control signals normally associated with a TMDS physical layer. The method includes the steps of inputting a sequence of analog voltage levels that represent a data block of three undenary symbols, decoding the data block of three undenary symbols, in accordance with a code, into a BIT output signal and an output data set, and writing the output data set when so decoded. The sequence of analog voltage levels are synchronized with a TMDS pixel clock. The output data set includes a TMDS "Data Enable" signal, two TMDS control signals, "[C1:C0]", and eight TMDS data signals, "[D7:D0]".

According to a fourth aspect, the present invention provides a digital interface including an encoder an encoder configured to accept an eight symbol, alternatively two symbol, binary input data set and to produce therefrom a three symbol undenary output data set and a decoder a decoder configured to accept a three symbol undenary input data set and to produce therefrom an eight symbol, alternatively two symbol, binary output data set. The binary input data set comprises a first binary word having two data bits, a second binary word having eight data bits, and a control bit indicating which one of the first and second binary word determines a resultant code. The binary output set comprises a first binary word having two data bits, a second binary word having eight data bits, and a control bit indicating which one of the first and second binary word was determined from the undenary input data set.

According to a fifth aspect, the present invention provides a digital interface adapted to transmit the data and control signals normally associated with a TMDS physical layer on four twisted wire pairs over a predetermined distance. The digital interface includes: a clock channel operating at a predetermined rate and transmitting a clock signal on a first one of the wire pairs; and a first, a second, and a third data channel, each operating at a same fixed multiple of the clock rate. Each of the first, second, and third data channels further comprise an encoder, a digital to analog converter, a pre-emphasis stage, an equalization stage, an analog to digital converter, and a decoder. The encoder is configured to accept, as an input set, a TMDS "Data Enable" signal, two TMDS control signals, "[C1:C0]", and eight TMDS data signals, "[D7:D0]". The encoder is also configured to produce, as an output set, a first sequence of three undenary symbols, and further configured to compute a running digital sum of the undenary symbols so produced. The digital to analog converter is adapted to accept the first sequence of three undenary symbols and to produce therefrom an output varying level analog voltage in synchronization with the clock channel. The pre-emphasis stage is adapted to condition and transmit the varying level analog voltage onto a corresponding further one of the four twisted wire pairs. The equalization stage is adapted to receive and condition the varying level analog voltage from the corresponding further one of the four twisted wire pairs. The analog to digital converter is adapted to accept the varying level analog voltage and to produce therefrom a second sequence of three undenary symbols in synchronization with the clock channel. The decoder is configured to accept, as an input set, the second sequence of three undenary symbols. The decoder is also configured to produce, as an output set, a TMDS "Data Enable" signal, two TMDS control signals, "[C1:C0]", and eight TMDS data signals, "[D7:D0]".

The present invention seeks to overcome or at least ameliorate one or more of several problems, including but not limited to: extending the range available for high definition television cabling.

BRIEF DESCRIPTION OF DRAWINGS

The accompanying figures further illustrate the present invention.

BRIEF DESCRIPTION OF THE SEVERAL VIEWS OF THE DRAWING

LIST OF REFERENCE NUMBERS FOR THE MAJOR ELEMENTS IN THE DRAWING

The following is a list of the major elements in the drawings in numerical order.

11R  8/2B:10B encoder (TMDS) (red channel)
11G  8/2B:10B encoder (TMDS) (green channel)
11B  8/2B:10B encoder (TMDS) (blue channel)
12R  pre-emphasis stage (red channel)
12G  pre-emphasis stage (green channel)
12B  pre-emphasis stage (blue channel)

-continued

| | |
|---|---|
| 16R | equalization stage (red channel) |
| 16G | equalization stage (green channel) |
| 16B | equalization stage (blue channel) |
| 17R | 10B:8/2B decoder (TMDS) (red channel) |
| 17G | 10B:8/2B decoder (TMDS) (green channel) |
| 17B | 10B:8/2B decoder (TMDS) (blue channel) |
| 21R | 8/2/1B:3U encoder (PAM-11) (red channel) |
| 21G | 8/2/1B:3U encoder (PAM-11) (green channel) |
| 21B | 8/2/1B:3U encoder (PAM-11) (blue channel) |
| 22R | pre-emphasis stage (red channel) |
| 22G | pre-emphasis stage (green channel) |
| 22B | pre-emphasis stage (blue channel) |
| 23R | analog to digital converter (ADC) (red channel) |
| 23G | analog to digital converter (ADC) (green channel) |
| 23B | analog to digital converter (ADC) (blue channel) |
| 26R | equalization stage (red channel) |
| 26G | equalization stage (green channel) |
| 26B | equalization stage (blue channel) |
| 27R | 3U:8/2/1B decoder (red channel) |
| 27G | 3U:8/2/1B decoder (green channel) |
| 27B | 3U:8/2/1B decoder (blue channel) |
| 28R | digital to analog converter (DAC) (red channel) |
| 28G | digital to analog converter (DAC) (green channel) |
| 28B | digital to analog converter (DAC) (blue channel) |
| 31 | TMDS data waveform (encoded data value 179) |
| 32 | clock waveform (pixel clock) |
| 33 | undenary data waveform (encoded data value 179) |
| 41 | (step of) reading TMDS input set |
| 42 | (step of) encoding TMDS input set into undenary three symbol block |
| 43 | (step of) outputting synchronized analog voltage sequence |
| 44 | (step of) selecting undenary three symbol block for BIT signal |
| 51 | (step of) outputting synchronized analog voltage sequence |
| 52 | (step of) decoding TMDS undenary three symbol block |
| 53 | (step of) writing TMDS output set |
| 54 | (step of) writing BIT output signal |
| 61 | video source |
| 62 | video sink |
| 64 | undenary transmitter |
| 65 | undenary receiver |
| 100 | pixel clock |
| 101 | inter-channel alignment stage |
| 120 | fourth twisted pair of wires (clock channel) |
| 121 | first twisted pair of wires (data channel 1 - red) |
| 122 | second twisted pair of wires (data channel 2 - green) |
| 123 | third twisted pair of wires (data channel 3 - blue) |
| 131 | TMDS data channel 1 (red) |
| 132 | TMDS data channel 2 (green) |
| 133 | TMDS data channel 3 (blue) |
| 150 | clock channel |
| 151 | PAM-11 data channel 1 (red) |
| 152 | PAM-11 data channel 2 (green) |
| 153 | PAM-11 data channel 3 (blue) |
| 601 | pixel clock signal |
| 611 | first red-value multilevel symbol ($R_{UA}$) |
| 612 | second red-value multilevel symbol ($R_{UB}$) |
| 613 | third red-value multilevel symbol ($R_{UC}$) |
| 621 | first green-value multilevel symbol ($G_{UA}$) |
| 622 | second green-value multilevel symbol ($G_{UB}$) |
| 623 | third green-value multilevel symbol ($G_{UC}$) |
| 631 | first blue-value multilevel symbol ($B_{UA}$) |
| 632 | second blue-value multilevel symbol ($B_{UB}$) |
| 633 | third blue-value multilevel symbol ($R_{UC}$) |

DETAILED DESCRIPTION OF THE INVENTION

The present invention is a digital interface physical layer suitable for use in high-speed digital communications.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

MODE(S) FOR CARRYING OUT THE INVENTION

The preferred embodiment of the present invention is described herein in the context of a an interface circuit and cabling that replaces the Transition Minimized Differential Signaling (TMDS) physical layer used in both the Digital Visual Interface (DVI) and High Definition Multimedia Interface (HMDI), which are widely used in consumer electronics.

Figure 2:
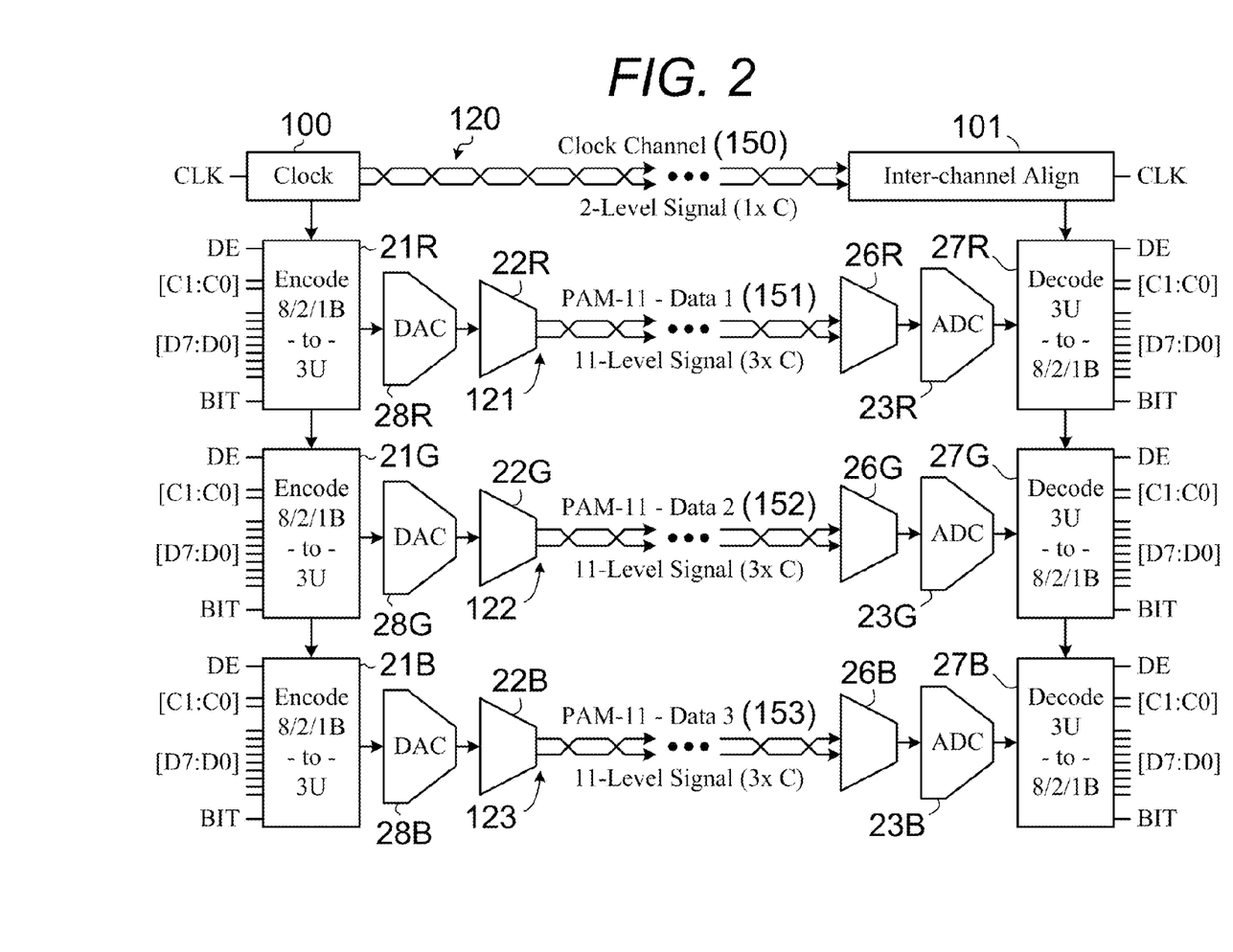
FIG. 2 shows a physical layer is accordance with the present invention.

Refer now to FIG. 2 and continue to refer to FIG. 1. One embodiment of the present invention is a 'pin-compatible' replacement for the well-known TMDS interfaces. For example, both the commercially available TMDS physical layer and the physical layer of the present invention are typically connected by four sets of unshielded twisted pairs (UTP), but not limited to such a connection.

Table 1, below, compares the TMDS physical known in the prior art with the undenary (base-11) physical layer, as referred to as eleven-level pulse amplitude modulation (PAM-11), of the present invention.

TABLE 1

| Characteristic | TMDS | Present Invention |
|---|---|---|
| Cable: | Special/Proprietary; Four (4) unshielded twisted wire pairs | Standard Cat-5e; Four (4) unshielded twisted wire pairs |
| Coupling: | DC (current mode) | AC (transformer) |
| Transmission Mode: | Simplex (one direction only); Point-to-Point only | Simplex (one direction only); Point-to-Point or Point-to-Multipoint. |
| Maximum Video Bandwidth | 8.16 Gbit/s | 8.16 Gbit/s |
| Maximum Audio Bandwidth | 36.86 Mbit/s | 36.86 Mbit/s |
| Maximum Resolution over Single Link at 24 bit/pixel | 2560 × 1600 p75 | 2560 × 1600 p75 |
| Pixel Clock: | 25 MHz to 340 MHz | 25 MHz to 340 MHz |
| Symbol Clock: | 75 MHz to 3.40 GHz | 75 MHz to 1.02 GHz |
| Symbol Encoding: | 8/2B:10B | 8/2/1B:3U |
| Valid Symbols: | 460 of 1024 possible | 432 of 1331 possible |
| Symbol Encoding: | 8/2B:10B | 8/2/1B:3U |

The three data channels (151, 152, and 153) shown in FIG. 2 are similar to one another. The discussion that follows addresses a single data channel 151, such as 'Data 1', that may be used, for example, to carry red video information.

At the transmitting end of the (red video) interface, signals normally present at a TMDS (red video) interface, the TMDS input set, consisting of a 'data enable' (DE) signal, two control bits [C1:C0], eight data bits [D7:D0], are fed into an eight-symbol, alternatively two-symbol, and alternatively one-symbol binary (base-two) to three-symbol undenary (base-eleven) (8/2/1B:3U) encoder 21R. In addition, a special built-in-test (BIT) signal is also fed into the 8/2/1B:3U encoder 21R. According to the present invention, there is a similar green video 8/2/1B:3U encoder 21G and a similar blue video 8/2/1B:3U encoder 21B.

The two control bits can be considered as a first binary word (i.e. of two-bit length) and the eight data bits can be considered as a second binary word (i.e. of eight-bit length). The TMDS 'data enable' (DE) signal is used as a control bit that indicates which one of the first and second binary words determines the encoding result.

When the TMDS 'data enable' (DE) signal is not set (e.g. logic '0'), the encoder 21R uses the value of the two control bits [C1:C0] to determine an output symbol triplet. When the TMDS 'data enable' (DE) signal is set (e.g. logic '1'), the encoder 21R uses the value of the eight data bits [D7:D0] to determine the output symbol triplet. When the BIT signal is set (e.g. logic '1'), the encoder 21R outputs the special BIT symbol triplet.

In a preferred embodiment, the 8/2/1B:3U encoder 21R translates the TMDS input set into a corresponding block of three multi-level symbols (e.g. symbol triplet) in accordance with a 8/2/1B:3U block code, such as shown in Table 2 herein, where each symbol can have any one of eleven possible values. In other embodiments the symbol blocks can consist of other than three symbols and each multi-level symbol can have other than eleven values.

The eleven possible symbol values will be represented on the first data channel 151 by eleven different voltage levels, measured between the two wires of the first twisted pair 141, one level being zero, five being positive voltage levels, and five being negative voltage levels. For convenience, these symbols and the corresponding voltage levels are referenced herein by the arbitrary numerical values −5, −4, −3, −2, −1, 0, +1, +2, +3, +4, and +5; the actual voltages may be numerically different from these values, and may be chosen to satisfy practical requirements involving, for example, power dissipation and noise margins. In a further embodiment of the present invention, the voltage levels are dynamically adjusted for a particular installation, such as one using existing Cat-5e cabling. In a similar manner, the second data channel 152 uses the second twisted pair of wires 142 and the third data channel 153 uses the third twisted pair of wires 143.

In one embodiment of the present invention, the actual output of the 8/2/1B:3U encoder 21R is a sequence of four-bit words or nibbles, each nibble having one of eleven possible values (e.g. 0000, 0001, 0010, 0011, 0100, 0101, 0110, 0111 and 1000, 1001, and 1010) representing the eleven possible undenary symbols, and successive triplets of nibbles defining the three symbols comprising the symbol triplet for the corresponding data/control/BIT word supplied to the encoder 21R. This sequence of four-bit nibbles produced by the encoder 21R is fed to a digital to analog converter (DAC) 28R, which produces a respective voltage level for each different symbol value and applies this voltage level to the twisted wire pair 121. Alternatively, further processing of the output of the DAC 28R, for example analog filtering, is allowed before it is applied to the twisted wire pair. For example, some embodiments include a pre-emphasis stage 22R.

The receiving end of the (red video) interface receives these voltage levels as inputs to an equalizer 26R, which compensates for the effects of different conductor lengths on distortion affecting the received signals. The compensated signal produced by the equalizer 26R is supplied to an analog to digital converter (ADC) 23R, which generates one of the eleven possible nibble values 0000 to 1010 corresponding to the voltage level closest to that present at the output of the equalizer 26R for each successive symbol period, such as an a rate of three symbols per pixel clock 100. In some embodiments a 16-level ADC with a 4-bit output is used to produce the nibbles. In other embodiments, higher resolution analog to digital converters are used where the outputs are then mapped to one of the eleven possible values.

The sequence of nibbles generated by the ADC 23R is passed to a 3U:8/2/1B decoder 27R which checks that the received encoded symbols are valid, and reverses the encoding performed by the encoder 21R. This decoder 27R also recognizes the special BIT sequence, which advantageously can be used to synchronize all three data channels with the clock channel. Advantageously, the BIT signal can be used to synchronize the decoders (27R, 27G, and 27B), within each data channel, with the pixel clock 100 by inter-channel alignment module 201.

An example of an 8/2/1B:3U code implemented in each of the encoders (21R, 21G, and 21B) is shown in Table 2 below.

TABLE 2

| Value | Symbol Block | | | Energy | Weight |
|---|---|---|---|---|---|
| | UA | UB | UC | | |
| data_000 | −1 | 0 | 1 | 2 | 0 |
| data_001 | −1 | 1 | 0 | 2 | 0 |
| data_002 | 0 | −1 | 1 | 2 | 0 |
| data_003 | 0 | 1 | −1 | 2 | 0 |
| data_004 | 1 | −1 | 0 | 2 | 0 |
| data_005 | 1 | 0 | −1 | 2 | 0 |
| data_006 | 0 | 0 | 2 | 2 | 2 |
| data_007 | 0 | 2 | 0 | 2 | 2 |
| data_008 | −1 | 0 | 2 | 3 | 1 |
| data_009 | −1 | 1 | 1 | 3 | 1 |
| data_010 | −1 | 2 | 0 | 3 | 1 |
| data_011 | 0 | −1 | 2 | 3 | 1 |
| data_012 | 0 | 2 | −1 | 3 | 1 |
| data_013 | 1 | −1 | 1 | 3 | 1 |
| data_014 | 1 | 1 | −1 | 3 | 1 |
| data_015 | 2 | −1 | 0 | 3 | 1 |
| data_016 | 2 | 0 | −1 | 3 | 1 |
| data_017 | −2 | 0 | 2 | 4 | 0 |
| data_018 | −2 | 1 | 1 | 4 | 0 |
| data_019 | −2 | 2 | 0 | 4 | 0 |
| data_020 | −1 | −1 | 2 | 4 | 0 |
| data_021 | −1 | 2 | −1 | 4 | 0 |
| data_022 | 0 | −2 | 2 | 4 | 0 |
| data_023 | 0 | 2 | −2 | 4 | 0 |
| data_024 | 1 | −2 | 1 | 4 | 0 |
| data_025 | 1 | 1 | −2 | 4 | 0 |
| data_026 | 2 | −2 | 0 | 4 | 0 |
| data_027 | 2 | −1 | −1 | 4 | 0 |
| data_028 | 2 | 0 | −2 | 4 | 0 |
| data_029 | −1 | 0 | 3 | 4 | 2 |
| data_030 | −1 | 1 | 2 | 4 | 2 |
| data_031 | −1 | 2 | 1 | 4 | 2 |
| data_032 | −1 | 3 | 0 | 4 | 2 |
| data_033 | 0 | −1 | 3 | 4 | 2 |
| data_034 | 0 | 3 | −1 | 4 | 2 |
| data_035 | 1 | −1 | 2 | 4 | 2 |
| data_036 | 1 | 2 | −1 | 4 | 2 |
| data_037 | 2 | −1 | 1 | 4 | 2 |
| data_038 | 2 | 1 | −1 | 4 | 2 |
| data_039 | 3 | −1 | 0 | 4 | 2 |
| data_040 | 3 | 0 | −1 | 4 | 2 |
| data_041 | −2 | 0 | 3 | 5 | 1 |
| data_042 | −2 | 1 | 2 | 5 | 1 |
| data_043 | −2 | 2 | 1 | 5 | 1 |
| data_044 | −2 | 3 | 0 | 5 | 1 |
| data_045 | −1 | −1 | 3 | 5 | 1 |
| data_046 | −1 | 3 | −1 | 5 | 1 |
| data_047 | 0 | −2 | 3 | 5 | 1 |
| data_048 | 0 | 3 | −2 | 5 | 1 |
| data_049 | 1 | −2 | 2 | 5 | 1 |
| data_050 | 1 | 2 | −2 | 5 | 1 |
| data_051 | 2 | −2 | 1 | 5 | 1 |
| data_052 | 2 | 1 | −2 | 5 | 1 |
| data_053 | 3 | −2 | 0 | 5 | 1 |
| data_054 | 3 | −1 | −1 | 5 | 1 |
| data_055 | 3 | 0 | −2 | 5 | 1 |
| data_056 | −3 | 0 | 3 | 6 | 0 |
| data_057 | −3 | 1 | 2 | 6 | 0 |
| data_058 | −3 | 2 | 1 | 6 | 0 |
| data_059 | −3 | 3 | 0 | 6 | 0 |
| data_060 | −2 | −1 | 3 | 6 | 0 |
| data_061 | −2 | 3 | −1 | 6 | 0 |
| data_062 | −1 | −2 | 3 | 6 | 0 |
| data_063 | −1 | 3 | −2 | 6 | 0 |
| data_064 | 0 | −3 | 3 | 6 | 0 |
| data_065 | 0 | 3 | −3 | 6 | 0 |
| data_066 | 1 | −3 | 2 | 6 | 0 |
| data_067 | 1 | 2 | −3 | 6 | 0 |
| data_068 | 2 | −3 | 1 | 6 | 0 |
| data_069 | 2 | 1 | −3 | 6 | 0 |
| data_070 | 3 | −3 | 0 | 6 | 0 |
| data_071 | 3 | −2 | −1 | 6 | 0 |

TABLE 2-continued

|  | Symbol Block | | | | |
|---|---|---|---|---|---|
| Value | UA | UB | UC | Energy | Weight |
| data_072 | 3 | −1 | −2 | 6 | 0 |
| data_073 | 3 | 0 | −3 | 6 | 0 |
| data_074 | −2 | 0 | 4 | 6 | 2 |
| data_075 | −2 | 1 | 3 | 6 | 2 |
| data_076 | −2 | 2 | 2 | 6 | 2 |
| data_077 | −2 | 3 | 1 | 6 | 2 |
| data_078 | −2 | 4 | 0 | 6 | 2 |
| data_079 | −1 | −1 | 4 | 6 | 2 |
| data_080 | −1 | 4 | −1 | 6 | 2 |
| data_081 | 0 | −2 | 4 | 6 | 2 |
| data_082 | 0 | 4 | −2 | 6 | 2 |
| data_083 | 1 | −2 | 3 | 6 | 2 |
| data_084 | 1 | 3 | −2 | 6 | 2 |
| data_085 | 2 | −2 | 2 | 6 | 2 |
| data_086 | 2 | 2 | −2 | 6 | 2 |
| data_087 | 3 | −2 | 1 | 6 | 2 |
| data_088 | 3 | 1 | −2 | 6 | 2 |
| data_089 | 4 | −2 | 0 | 6 | 2 |
| data_090 | 4 | −1 | −1 | 6 | 2 |
| data_091 | 4 | 0 | −2 | 6 | 2 |
| data_092 | −3 | 0 | 4 | 7 | 1 |
| data_093 | −3 | 1 | 3 | 7 | 1 |
| data_094 | −3 | 2 | 2 | 7 | 1 |
| data_095 | −3 | 3 | 1 | 7 | 1 |
| data_096 | −3 | 4 | 0 | 7 | 1 |
| data_097 | −2 | −1 | 4 | 7 | 1 |
| data_098 | −2 | 4 | −1 | 7 | 1 |
| data_099 | −1 | −2 | 4 | 7 | 1 |
| data_100 | −1 | 4 | −2 | 7 | 1 |
| data_101 | 0 | −3 | 4 | 7 | 1 |
| data_102 | 0 | 4 | −3 | 7 | 1 |
| data_103 | 1 | −3 | 3 | 7 | 1 |
| data_104 | 1 | 3 | −3 | 7 | 1 |
| data_105 | 2 | −3 | 2 | 7 | 1 |
| data_106 | 2 | 2 | −3 | 7 | 1 |
| data_107 | 3 | −3 | 1 | 7 | 1 |
| data_108 | 3 | 1 | −3 | 7 | 1 |
| data_109 | 4 | −3 | 0 | 7 | 1 |
| data_110 | 4 | −2 | −1 | 7 | 1 |
| data_111 | 4 | −1 | −2 | 7 | 1 |
| data_112 | 4 | 0 | −3 | 7 | 1 |
| data_113 | −4 | 0 | 4 | 8 | 0 |
| data_114 | −4 | 1 | 3 | 8 | 0 |
| data_115 | −4 | 2 | 2 | 8 | 0 |
| data_116 | −4 | 3 | 1 | 8 | 0 |
| data_117 | −4 | 4 | 0 | 8 | 0 |
| data_118 | −3 | −1 | 4 | 8 | 0 |
| data_119 | −3 | 4 | −1 | 8 | 0 |
| data_120 | −2 | −2 | 4 | 8 | 0 |
| data_121 | −2 | 4 | −2 | 8 | 0 |
| data_122 | −1 | −3 | 4 | 8 | 0 |
| data_123 | −1 | 4 | −3 | 8 | 0 |
| data_124 | 0 | −4 | 4 | 8 | 0 |
| data_125 | 0 | 4 | −4 | 8 | 0 |
| data_126 | 1 | −4 | 3 | 8 | 0 |
| data_127 | 1 | 3 | −4 | 8 | 0 |
| data_128 | 2 | −4 | 2 | 8 | 0 |
| data_129 | 2 | 2 | −4 | 8 | 0 |
| data_130 | 3 | −4 | 1 | 8 | 0 |
| data_131 | 3 | 1 | −4 | 8 | 0 |
| data_132 | 4 | −4 | 0 | 8 | 0 |
| data_133 | 4 | −3 | −1 | 8 | 0 |
| data_134 | 4 | −2 | −2 | 8 | 0 |
| data_135 | 4 | −1 | −3 | 8 | 0 |
| data_136 | 4 | 0 | −4 | 8 | 0 |
| data_137 | −3 | 0 | 5 | 8 | 2 |
| data_138 | −3 | 1 | 4 | 8 | 2 |
| data_139 | −3 | 2 | 3 | 8 | 2 |
| data_140 | −3 | 3 | 2 | 8 | 2 |
| data_141 | −3 | 4 | 1 | 8 | 2 |
| data_142 | −3 | 5 | 0 | 8 | 2 |
| data_143 | −2 | −1 | 5 | 8 | 2 |
| data_144 | −2 | 5 | −1 | 8 | 2 |
| data_145 | −1 | −2 | 5 | 8 | 2 |
| data_146 | −1 | 5 | −2 | 8 | 2 |
| data_147 | 0 | −3 | 5 | 8 | 2 |
| data_148 | 0 | 5 | −3 | 8 | 2 |
| data_149 | 1 | −3 | 4 | 8 | 2 |
| data_150 | 1 | 4 | −3 | 8 | 2 |
| data_151 | 2 | −3 | 3 | 8 | 2 |
| data_152 | 2 | 3 | −3 | 8 | 2 |
| data_153 | 3 | −3 | 2 | 8 | 2 |
| data_154 | 3 | 2 | −3 | 8 | 2 |
| data_155 | 4 | −3 | 1 | 8 | 2 |
| data_156 | 4 | 1 | −3 | 8 | 2 |
| data_157 | 5 | −3 | 0 | 8 | 2 |
| data_158 | 5 | −2 | −1 | 8 | 2 |
| data_159 | 5 | −1 | −2 | 8 | 2 |
| data_160 | 5 | 0 | −3 | 8 | 2 |
| data_161 | −4 | 0 | 5 | 9 | 1 |
| data_162 | −4 | 1 | 4 | 9 | 1 |
| data_163 | −4 | 2 | 3 | 9 | 1 |
| data_164 | −4 | 3 | 2 | 9 | 1 |
| data_165 | −4 | 4 | 1 | 9 | 1 |
| data_166 | −4 | 5 | 0 | 9 | 1 |
| data_167 | −3 | −1 | 5 | 9 | 1 |
| data_168 | −3 | 5 | −1 | 9 | 1 |
| data_169 | −2 | −2 | 5 | 9 | 1 |
| data_170 | −2 | 5 | −2 | 9 | 1 |
| data_171 | −1 | −3 | 5 | 9 | 1 |
| data_172 | −1 | 5 | −3 | 9 | 1 |
| data_173 | 0 | −4 | 5 | 9 | 1 |
| data_174 | 0 | 5 | −4 | 9 | 1 |
| data_175 | 1 | −4 | 4 | 9 | 1 |
| data_176 | 1 | 4 | −4 | 9 | 1 |
| data_177 | 2 | −4 | 3 | 9 | 1 |
| data_178 | 2 | 3 | −4 | 9 | 1 |
| data_179 | 3 | −4 | 2 | 9 | 1 |
| data_180 | 3 | 2 | −4 | 9 | 1 |
| data_181 | 4 | −4 | 1 | 9 | 1 |
| data_182 | 4 | 1 | −4 | 9 | 1 |
| data_183 | 5 | −4 | 0 | 9 | 1 |
| data_184 | 5 | −3 | −1 | 9 | 1 |
| data_185 | 5 | −2 | −2 | 9 | 1 |
| data_186 | 5 | −1 | −3 | 9 | 1 |
| data_187 | 5 | 0 | −4 | 9 | 1 |
| data_188 | −5 | 0 | 5 | 10 | 0 |
| data_189 | −5 | 1 | 4 | 10 | 0 |
| data_190 | −5 | 2 | 3 | 10 | 0 |
| data_191 | −5 | 3 | 2 | 10 | 0 |
| data_192 | −5 | 4 | 1 | 10 | 0 |
| data_193 | −5 | 5 | 0 | 10 | 0 |
| data_194 | −4 | −1 | 5 | 10 | 0 |
| data_195 | −4 | 5 | −1 | 10 | 0 |
| data_196 | −3 | −2 | 5 | 10 | 0 |
| data_197 | −3 | 5 | −2 | 10 | 0 |
| data_198 | −2 | −3 | 5 | 10 | 0 |
| data_199 | −2 | 5 | −3 | 10 | 0 |
| data_200 | −1 | −4 | 5 | 10 | 0 |
| data_201 | −1 | 5 | −4 | 10 | 0 |
| data_202 | 0 | −5 | 5 | 10 | 0 |
| data_203 | 0 | 5 | −5 | 10 | 0 |
| data_204 | 1 | −5 | 4 | 10 | 0 |
| data_205 | 1 | 4 | −5 | 10 | 0 |
| data_206 | 2 | −5 | 3 | 10 | 0 |
| data_207 | 2 | 3 | −5 | 10 | 0 |
| data_208 | 3 | −5 | 2 | 10 | 0 |
| data_209 | 3 | 2 | −5 | 10 | 0 |
| data_210 | 4 | −5 | 1 | 10 | 0 |
| data_211 | 4 | 1 | −5 | 10 | 0 |
| data_212 | 5 | −5 | 0 | 10 | 0 |
| data_213 | 5 | −4 | −1 | 10 | 0 |
| data_214 | 5 | −3 | −2 | 10 | 0 |
| data_215 | 5 | −2 | −3 | 10 | 0 |
| data_216 | 5 | −1 | −4 | 10 | 0 |
| data_217 | 5 | 0 | −5 | 10 | 0 |
| data_218 | −4 | 1 | 5 | 10 | 2 |
| data_219 | −4 | 2 | 4 | 10 | 2 |
| data_220 | −4 | 3 | 3 | 10 | 2 |
| data_221 | −4 | 4 | 2 | 10 | 2 |
| data_222 | −4 | 5 | 1 | 10 | 2 |
| data_223 | 1 | −4 | 5 | 10 | 2 |

TABLE 2-continued

| | Symbol Block | | | | |
|---|---|---|---|---|---|
| Value | UA | UB | UC | Energy | Weight |
| data_224 | 1 | 5 | −4 | 10 | 2 |
| data_225 | 2 | −4 | 4 | 10 | 2 |
| data_226 | 2 | 4 | −4 | 10 | 2 |
| data_227 | 3 | −4 | 3 | 10 | 2 |
| data_228 | 3 | 3 | −4 | 10 | 2 |
| data_229 | 4 | −4 | 2 | 10 | 2 |
| data_230 | 4 | 2 | −4 | 10 | 2 |
| data_231 | 5 | −4 | 1 | 10 | 2 |
| data_232 | 5 | 1 | −4 | 10 | 2 |
| data_233 | −5 | 1 | 5 | 11 | 1 |
| data_234 | −5 | 2 | 4 | 11 | 1 |
| data_235 | −5 | 3 | 3 | 11 | 1 |
| data_236 | −5 | 4 | 2 | 11 | 1 |
| data_237 | −5 | 5 | 1 | 11 | 1 |
| data_238 | 1 | −5 | 5 | 11 | 1 |
| data_239 | 1 | 5 | −5 | 11 | 1 |
| data_240 | 2 | −5 | 4 | 11 | 1 |
| data_241 | 2 | 4 | −5 | 11 | 1 |
| data_242 | 3 | −5 | 3 | 11 | 1 |
| data_243 | 3 | 3 | −5 | 11 | 1 |
| data_244 | 4 | −5 | 2 | 11 | 1 |
| data_245 | 4 | 2 | −5 | 11 | 1 |
| data_246 | 5 | −5 | 1 | 11 | 1 |
| data_247 | 5 | 1 | −5 | 11 | 1 |
| data_248 | −5 | 2 | 5 | 12 | 2 |
| data_249 | −5 | 3 | 4 | 12 | 2 |
| data_250 | −5 | 4 | 3 | 12 | 2 |
| data_251 | −5 | 5 | 2 | 12 | 2 |
| data_252 | 2 | −5 | 5 | 12 | 2 |
| data_253 | 2 | 5 | −5 | 12 | 2 |
| data_254 | 3 | −5 | 4 | 12 | 2 |
| data_255 | 3 | 4 | −5 | 12 | 2 |
| control_0 | 4 | −5 | 3 | 12 | 2 |
| control_1 | 4 | 3 | −5 | 12 | 2 |
| control_2 | 5 | −5 | 2 | 12 | 2 |
| control_3 | 5 | 2 | −5 | 12 | 2 |
| BIT | 2 | 0 | 0 | 2 | 2 |

Each entry in Table 2 comprises four parts: the value of the data/control/BIT word in decimal; the values of the three undenary (base-eleven) symbols (UA, UB, and UC) which together form the symbol triplet for that data/control/BIT word; the 'Energy' of that encoded value, and the 'Weight' (DC residual) associated with that encoded value. The energy is derived for each encoded value by summing the absolute (unsigned) values of the individual undenary symbols making up that encoded value. The DC residual is derived for each encoded value by summing the unsigned values of the individual undenary symbols making up that encoded value. Thus, the undenary code word for the data word having decimal value 179 (data_179) is the triplet of symbols (3, −4, 2), and the associated energy and weight (DC residual) is 9 and 1, respectively.

The weight is significant in relation to the desirability of maintaining DC balance on a twisted-pair conductor, to avoid sustained presence of voltage offsets on the conductor. The presence of such offsets for extended periods causes difficulties in systems using transformer coupling and must therefore be avoided. The weight for each encoded value is used to keep such offsets within predetermined limits.

Table 2 was constructed as follows. First, all 3-digit base-11 numbers are listed in a spreadsheet. Next, they are converted into voltage level triplets where '−5' corresponds to digit '0', '−4' corresponds to digit '1', etc. The DC residual is calculated by summing each value of the voltage level triplet.

The voltage level triplets are then sorted by DC residual. Triplets having either a DC residual with a magnitude greater than two (>2) are eliminated. Note that the negative residuals are not separately listed in Table 2, but are dependent upon the present value of a running digital sum (RDS)

The triplet symbol energy is computed by summing the absolute values of each of voltage level triplet. The following seven low energy symbols that do not have a zero crossing: (0,0,0), (0,0,1), (0,1,0), (1,0), (0,1,1), (1,0,1), and (1,1,0) are also eliminated from the Table.

Advantageously, this leaves exactly two hundred sixty one (261) remaining symbols, where one hundred seven one (171) have two variants and ninety (90) have a single variant. Finally, reserve a built-in-test (BIT) symbol that aligns with the pixel frame (first variant is: 2,0,0), and is therefore reserved for that purpose.

The remaining symbols are numbered in order with the lowest energy symbol corresponding to the lowest pixel intensity and with the control symbols following the data symbols. Higher energy symbols will create more undesirable electromagnetic interference than lower level symbols as taught in Deloit (U.S. Pat. No. 6,052,390) at column 12, lines 32-48.

The 8/2/1B:3U encoder 21 contains a counter which maintains a running digital sum (RDS) of the weights of all transmitted code words. As each successive data/control/BIT word is encoded, it's associated weight as listed in Table 2 (and whether its weight is greater than zero or not) is compared with this cumulative sum. If the cumulative sum is positive and the weight of the code word is nonzero, the code word (and thus its weight) is inverted. For example, the code word for the data word having decimal value 179 (data_179) would in this case become the triplet (−3, 4, −2), with a weight of −1.

An advantageous property of the code defined by Table 2 is that the weight of any code word is constrained to be less than or equal to two (2). This constraint on code word weight further assists in minimizing voltage offsets on the conductor.

Figure 3:
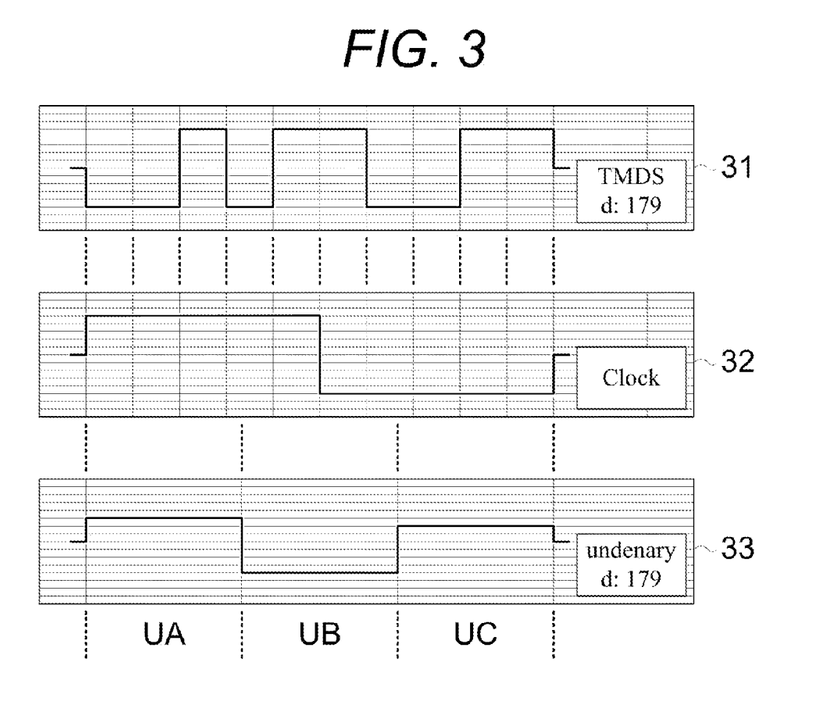
FIG. 3 is a timing comparison between the physical layer of the prior art and the present invention.

FIG. 3 shows waveforms which would appear when the data word having a value of 179 (data_179) is transmitted over the traditional TMDS physical layer 31 and the inventive undenary physical layer 33 of the present invention. As a reference, the clock signal 32 used with the present invention is the same as that used in the TMDS physical layer. FIG. 3 clearly shows they lower symbol clock of the present invention (e.g. 3× the pixel clock) as compared with the TMDS data symbol clock (e.g. 10× the pixel clock).

The encoder 21 and decoder 27 may be implemented, for example, using look-up tables held in read-only memory or using digital logic circuitry. Alternatively they may be implemented using stored program instructions to control the operation of a processor to derive the required values from logical formulae defining the required properties of the encoding.

Figure 4:
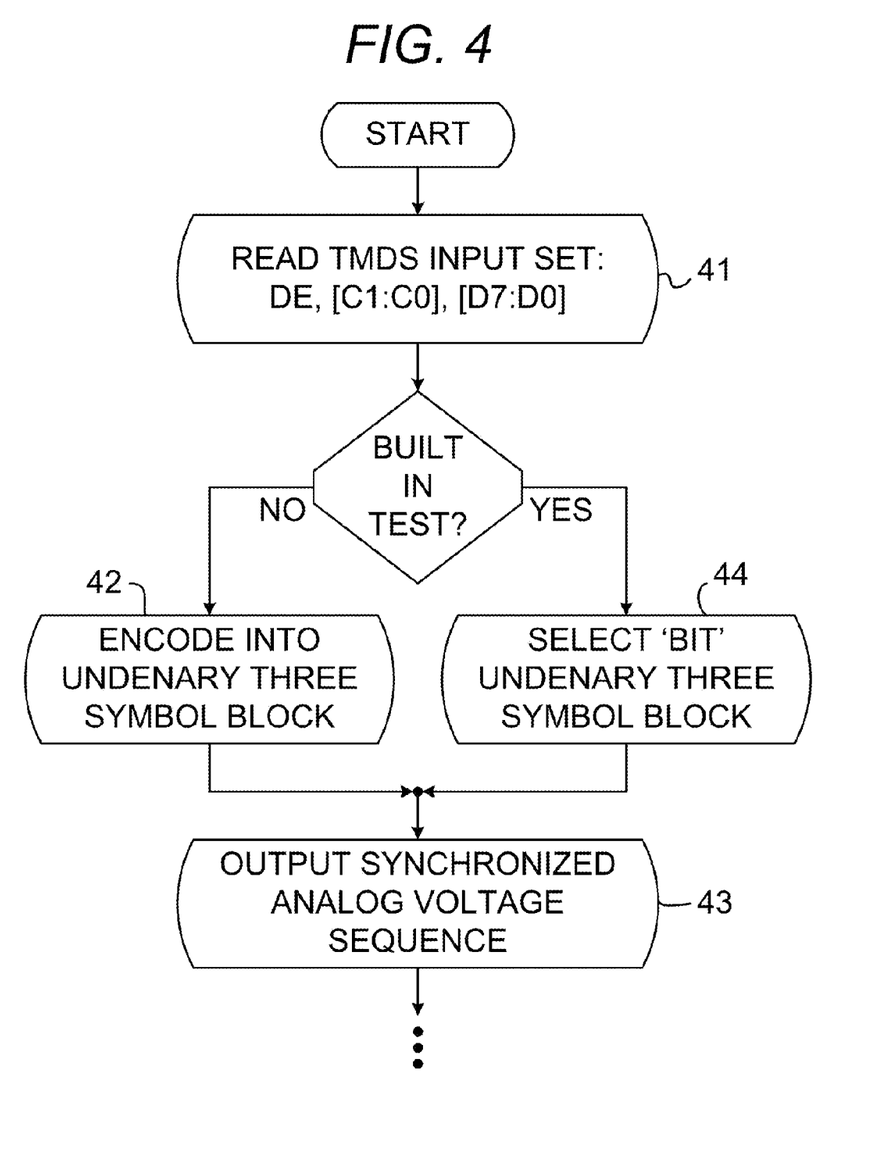
FIG. 4 depicts the encoding of signals typically present at a TMDS interface using a new inventive encoding method in accordance with one illustrative embodiment of the present invention.

FIG. 4 illustrates the encoding method, for an 8/2/1B:3U encoder, in accordance with the present invention. First, the TMDS input set is read (step 41) into the encoder, where this input set includes: a TMDS "Data Enable" signal, two TMDS control signals, "[C1:C0]", and eight TMDS data signals, "[D7:D0]". Next, if the BIT signal is not set (e.g. logic '0') then the input set is encoded (step 42) into a data block of three undenary (base-11) symbols, selected from a predetermined group of allowable data blocks in accordance with a code, such as that listed in Table 2. Finally, the data block of three undenary (base-11) symbols is output (step 43) as a sequence of analog voltage levels that are synchronized with the TMDS pixel clock 100 (shown in FIG. 2). When the BIT signal is set (e.g. logic '1'), then a special data block of three undenary (base-11) symbols is output.

Figure 5:
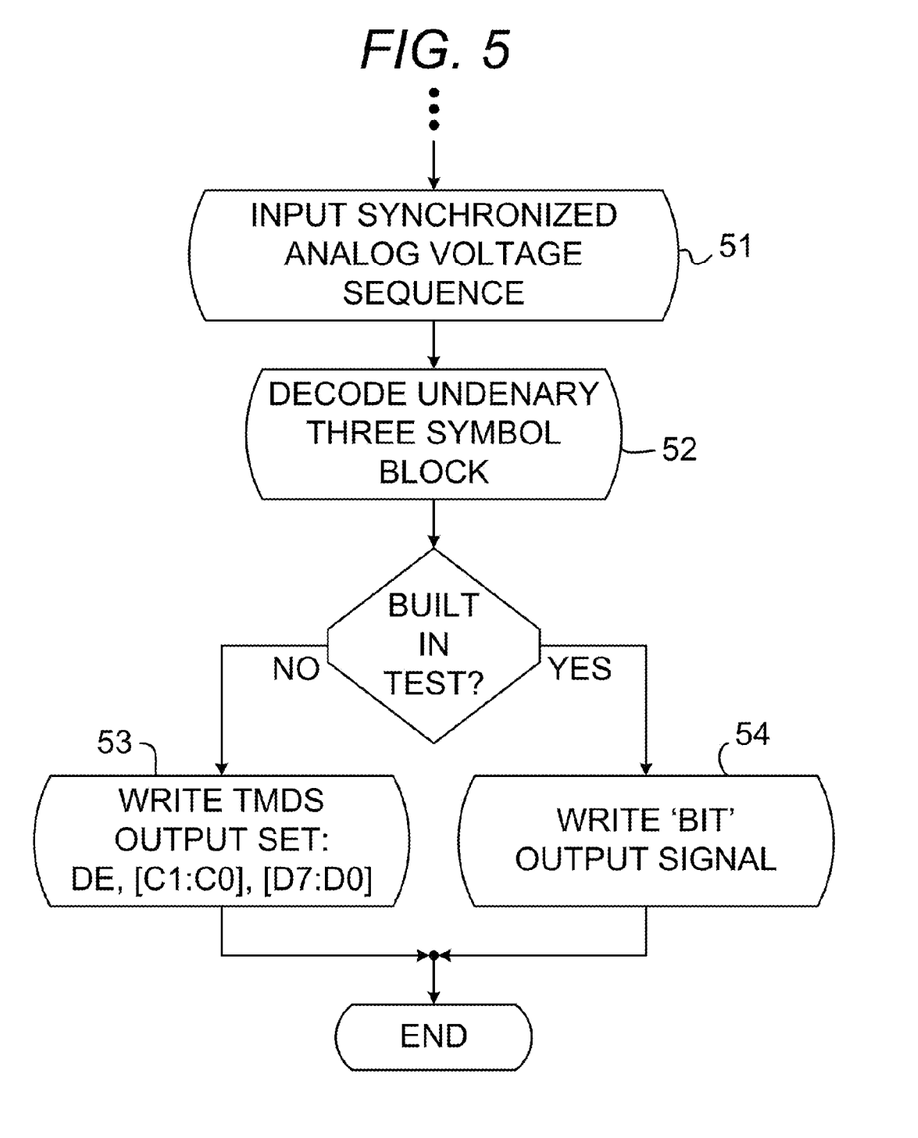
FIG. 5 depicts the decoding of signals encoded by the method of FIG. 4 into signals that are typically present at a TMDS in accordance with one illustrative embodiment of the present invention.

FIG. 5 illustrates the decoding method, for a 3U:8/2/1B encoder, in accordance with the present invention. First, a sequence of analog voltage levels, that are synchronized with the TMDS pixel clock 100 (shown in FIG. 2) and represent a data block of three undenary symbols, is accepted as an input (step 51). Next, the data block of three undenary (base-11) symbols is decoded (step 52), in accordance with a code such as that shown in Table 2, into a BIT output signal and a TMDS output set consisting of a TMDS "Data Enable" signal, two TMDS control signals, "[C1:C0]", and eight TMDS data signals, "[D7:D0]". Finally, the TMDS output set is written out (step 53). When the BIT data block is decoded, a BIT signal is written out (step 54).

It will be obvious to a person skilled in the art, given the encodings defined by Table 2, that additional encodings having the same properties may be derived therefrom by simple invariance transformations. For example, an alternate encoding table can be created using the same set of 'values' and the same set of 'symbol blocks' as in Table 2, but where this alternate table has one-to-one matching between the 'values' and the 'symbol blocks' that differs from Table 2.

Figure 6:
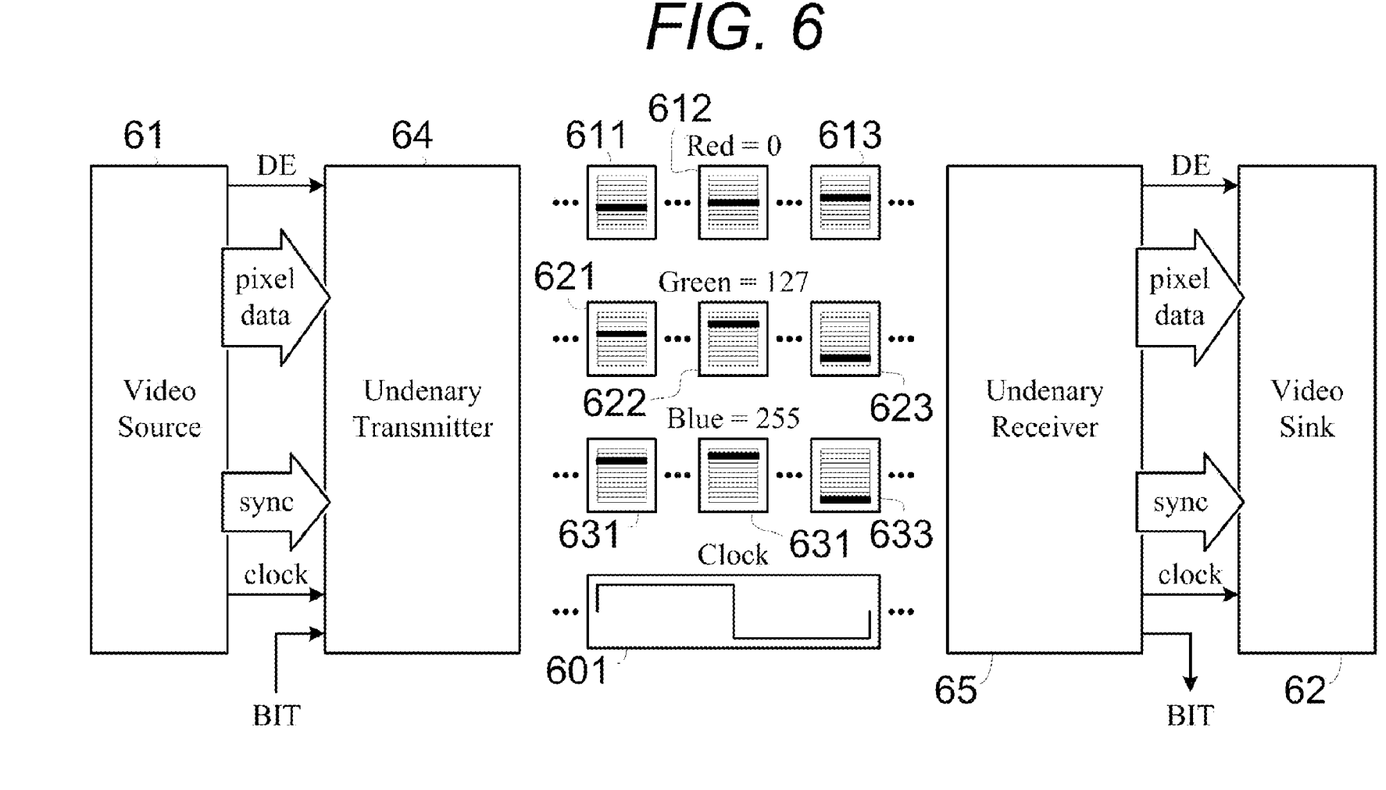
FIG. 6 depicts a digital video interface in accordance with one illustrative embodiment of the present invention.

Finally refer to FIG. 6 which depicts a digital video interface in accordance with one illustrative embodiment of the present invention and summarizes the above description. As illustrated, a video source 61 is transmitting a single color pixel having an RGB value (0, 127, 255), which corresponds to a 'dark sky blue' color to a video sink 62. The RGB pixel value is transmitted as three groups of three multilevel symbols per group. A pixel clock signal 601, running at one-third the symbol rate, is transferred as a bi-level digital voltage between the undenary transmitter 64 and the undenary receiver 65, such as by using a Cat-5e unshielded twisted wire pair.

The Red video value for the dark sky blue pixel is '0', which corresponds to the undenary symbol triplet (−1, 0, 1) according to Table 2. The first red-value multilevel symbol 611 (UA), the second red-value multilevel symbol 612 (UB), and the third first red-value multilevel symbol 613 (UA), are transferred as a vary-leveling analog voltage between the undenary transmitter 64 and the undenary receiver 65, such as by using a Cat-5e unshielded twisted wire pair.

The Green video value for the dark sky blue pixel is '127', which corresponds to the undenary symbol triplet (1, 3, −4) according to Table 2. The first blue-value multilevel symbol 621 (UA), the second blue-value multilevel symbol 622 (UB), and the third first blue-value multilevel symbol 623 (UA), are transferred as a vary-leveling analog voltage between the undenary transmitter 64 and the undenary receiver 65, such as by using a Cat-5e unshielded twisted wire pair.

The Blue video value for the dark sky blue pixel is '255', which corresponds to the undenary symbol triplet (3, 4, −5) according to Table 2. The first green-value multilevel symbol 621 (UA), the second green-value multilevel symbol 622 (UB), and the third first green-value multilevel symbol 623 (UA), are transferred as a vary-leveling analog voltage between the undenary transmitter 64 and the undenary receiver 65, such as by using a Cat-5e unshielded twisted wire pair.

In one embodiment, the video source 61 provides the same input data set that is used in a traditional TMDS interface to the undenary transmitter 64. In this embodiment, the undenary receiver provides the same output data set to the video sink 62 as a traditional TMDS interface. Advantageously, the digital video can be built as a pin-compatible replacement for interfaces that are presently available and is compatible with high definition content protection (HDCP).

INDUSTRIAL APPLICABILITY

To solve the aforementioned problems, the present invention is a unique system that allows for extending high-definition television cables by transmitting serial multi-level pixel data at a lower symbol rate than required for a bi-level (binary) symbol.

LIST OF ACRONYMS USED IN THE DETAILED DESCRIPTION OF THE INVENTION

The following is a list of the acronyms used in the specification in alphabetical order.

| | |
|---|---|
| ADC | analog to digital converter |
| B | blue |
| BIT | built-in-test |
| C | clock (frequency) |
| C1:C0 | two control bits (C1 is most significant) |
| d | data (value) |
| DAC | digital to analog converter |
| DC | direct current |
| DE | data enable (TMDS signal) |
| DVI | digital visual interface |
| D7:D0 | eight bits of data (D7 is most significant) |
| EMI | electromagnetic interference |
| G | green |
| Gbps | gigabit per second |
| GHz | gigahertz |
| HDCP | high definition content protection |
| HMDI | high definition multimedia interface |
| MHz | megahertz |
| PAM | pulse amplitude modulation |
| PAM-4 | four-level pulse amplitude modulation |
| PAM-5 | five-level pulse amplitude modulation |
| PAM-11 | eleven-level pulse amplitude modulation |
| R | red |
| RDS | running digital sum |
| RGB | red-green-blue (video data) |
| TMDS | transition minimized differential signaling |
| UA | base-eleven symbol (most significant symbol in the group ABC) |
| UB | base-eleven symbol (middle symbol in the group ABC) |
| UC | base-eleven symbol (least significant symbol in the group ABC) |
| UTP | unshielded twisted pairs |
| 3U:8/2/1B | three-symbol undenary (base-eleven) to eight-symbol, alternatively two-symbol, and alternatively one-symbol binary (base-two) |
| 8/2B:10B | eight-symbol, alternatively two-symbol, binary (base-two) to ten-symbol binary (base-two) |
| 8/2/1B:3U | eight-symbol, alternatively two-symbol, and alternatively one-symbol binary (base-two) to three-symbol undenary (base-eleven) |
| 10B:8/2B | ten-symbol binary (base-two) to eight-symbol, alternatively two-symbol, binary (base-two) |

ALTERNATE EMBODIMENTS

Alternate embodiments may be devised without departing from the spirit or the scope of the invention. For example, a sixteen level symbol could be used to represent the eleven level data code shown herein to take advantage of commercially available flash 4-bit analog to digital converters as well as to allow for tuning energy and DC residual levels.

What is claimed is:

1. A digital visual interface system configured to transmit data, control, and BIT signals, said system comprising:
(a) a clock channel (150) transmitting a clock signal at a predetermined rate;

(b) a first data channel (151) transmitting data as a sequence of blocks of multi-level symbols being sent at a fixed multiple of the clock rate;

(c) a second data channel (152) transmitting data as a sequence of blocks of multi-level symbols being sent at said fixed multiple of the clock rate;

(d) a third data channel (153) transmitting data as a sequence of blocks of multi-level symbols being sent at said fixed multiple of the clock rate;

(e) wherein each block of multi-level symbols within said first, second, and third data channels is aligned with reference to the clock channel;

(f) wherein each block of multi-level symbols comprises a sequence of at least three multi-level symbols;

(g) wherein each multi-level symbol has an analog voltage level selected from a predetermined number of possible values, said predetermined number being an integer greater than two; and (h) wherein said fixed multiple of the clock rate being an integer greater than one.

2. The system of claim 1, wherein each data channel further includes:

(a) an encoder (21R, 21G, 21B) for deriving a code block for each respective data, control, and BIT signal in accordance with a predetermined code; and (b) digital to analog converter (28R, 28G, 28B) adapted to accept the code block from the encoder and to generate, as an output, the group of multi-level symbols corresponding thereto;

(c) transmission means (121, 122, 123) coupled to the digital to analog converter for transmitting the group of multi-level symbols over said data channel;

(d) an analog to digital converter (23R, 23G, 23B) coupled to the transmission means and adapted to accept, as an input, the group of multilevel symbols and to generate the code block corresponding thereto;

(e) a decoder (27R, 27G, 27B) adapted to accept the code block from the analog to digital converter and to derive each respective data, control, and BIT signal from said code block in accordance with the predetermined code.

3. The system of claim 2, wherein said transmission means comprises:

(a) a twisted pair of wires;

(b) a transformer coupling the output of the digital to analog converter to said twisted pair of wires; and (c) a transformer coupling said twisted pair of wires to the input of the analog to digital converter.

4. The system of claim 2, wherein said transmission means comprises:

(a) a pre-emphasis stage (22R, 22G, 22B); and (b) an equalization stage (26R, 26G, 22B).

5. The system of claim 1, wherein each multi-level symbol has an analog voltage level selected from eleven possible values.

6. The system of claim 5, wherein each said block of multi-level symbols conforms to the code defined in Table 2.

7. A method of transmitting the data and control signals normally associated with a transition minimized differential signaling (TMDS) physical layer, said method comprising the steps of:

(a) reading (step 41) as an input data set,
 (i) a TMDS "Data Enable" signal,
 (ii) two TMDS control signals, "[C1:C0]", and
 (iii) eight TMDS data signals, "[D7:D0]";

(b) encoding (step 42) said input data set into a data block of three undenary symbols, selected from a predetermined group of allowable data blocks in accordance with a code; and (c) outputting (step 43) the data block of three undenary symbols as a sequence of analog voltage levels that are synchronized with a TMDS pixel clock.

8. The method of claim 7 wherein each allowable data block:

(a) has a DC residual magnitude value of less than three-levels; and (b) has an energy magnitude value greater than one-level, and (c) does not consist only of two one-level symbols of the same polarity and a single zero-level symbol.

9. The method of claim 7 wherein:

(a) the data block is encoded using the code defined in Table 2.

10. The method of claim 7 further comprising the steps of:

(a) determining whether a built-in-test signal is present; and when said built-in-test signal is present, (b) selecting (step 44) a data block of three undenary symbols corresponding to a 'BIT' signal.

11. A method of receiving the data and control signals normally associated with a transition minimized differential signaling (TMDS) physical layer, said method comprising the steps of:

(a) inputting (step 51) a sequence of analog voltage levels that represent a data block of three undenary symbols and are synchronized with a TMDS pixel clock;

(b) decoding (step 52) said data block of three undenary symbols, in accordance with a code, into a BIT output signal and an output data set consisting of,
 (i) a TMDS "Data Enable" signal,
 (ii) two TMDS control signals, "[C1:C0]", and
 (iii) eight TMDS data signals, "[D7:D0]"; and (c) writing (step 54) said output data set when so decoded.

12. The method of claim 11 further comprising:

(a) decoding said data block of three undenary symbols, in accordance with a code, into a BIT output signal; and (b) writing (step 54) said BIT signal when so decoded.

13. The method of claim 11 wherein:

(a) the data block is decoded using the code defined in Table 2.

14. A digital interface comprising:

(a) an encoder configured to accept an eight symbol, alternatively two symbol, binary input data set and to produce therefrom a three symbol undenary output data set, wherein said binary input data set comprises
 (i) a first binary word having two data bits,
 (ii) a second binary word having eight data bits, and
 (iii) a control bit indicating which one of the first and second binary word determines a resultant code; and (b) a decoder configured to accept a three symbol undenary input data set and to produce therefrom an eight symbol, alternatively two symbol, binary output data set, wherein said binary output set comprises
 (i) a first binary word having two data bits,
 (ii) a second binary word having eight data bits, and
 (iii) a control bit indicating which one of the first and second binary word was determined from the undenary input data set.

15. A digital interface adapted to transmit the data and control signals normally associated with a transition minimized differential signaling (TMDS) physical layer on four twisted wire pairs over a predetermined distance, said digital interface comprising:
  (a) a clock channel operating at a predetermined rate and transmitting a clock signal on a first one of said wire pairs;
  (b) a first, a second, and a third data channel, each operating at a same fixed multiple of the clock rate; and
  (c) wherein each of the first, second, and third data channels further comprise
    (i) an encoder,
      (A) configured to accept, as an input set, a TMDS "Data Enable" signal, two TMDS control signals, "[C1:C0]", and eight TMDS data signals, "[D7:D0]",
      (B) configured to produce, as an output set, a first sequence of three undenary symbols, and
      (C) further configured to compute a running digital sum of the undenary symbols so produced,
    (ii) a digital to analog converter adapted to accept said first sequence of three undenary symbols and to produce therefrom an output varying level analog voltage in synchronization with said clock channel,
    (iii) a pre-emphasis stage adapted to condition and transmit the varying level analog voltage onto a corresponding further one of the four twisted wire pairs,
    (iv) an equalization stage adapted to receive and condition said varying level analog voltage from said corresponding further one of the four twisted wire pairs,
    (v) an analog to digital converter adapted to accept said varying level analog voltage and to produce therefrom a second sequence of three undenary symbols in synchronization with said clock channel,
    (vi) a decoder,
      (A) configured to accept, as an input set, the second sequence of three undenary symbols, and
      (B) configured to produce, as an output set, a TMDS "Data Enable" signal, two TMDS control signals, "[C1:C0]", and eight TMDS data signals, "[D7:D0]".

16. The interface of claim 15, wherein the clock channel and each of the first, second, and third data channels uses transformer coupling to connect to its corresponding wire pair.

17. The interface of claim 15, wherein:
  (a) said encoder is further configured to accept as an input, a built-in-test signal and to produce therefrom, as an output set, a predetermined sequence of three undenary symbols; and
  (b) said decoder is further configured to recognize the predetermined sequence of three undenary symbols corresponding to said built-in-test signal and to produce therefrom a built-in-test signal output.

18. The interface of claim 15, wherein:
  (a) the encoder encodes said first sequence of three undenary symbols in accordance with the code defined in Table 2 herein; and
  (b) the decoder decodes said second sequence of three undenary symbols in accordance with the code defined in Table 2 herein.

19. The interface of claim 15, wherein said same fixed multiple of the clock rate is three times the clock rate.

20. The interface of claim 15, wherein voltage levels corresponding to specific undenary symbols, as produced by said digital to analog converter, are dynamically adjusted for a particular wiring installation.

21. The interface of claim 15, wherein said digital to analog converter and said analog to digital converter each have a resolution of greater than 4-bits.

* * * * *